(12) United States Patent
Lee et al.

(10) Patent No.: US 7,199,051 B2
(45) Date of Patent: Apr. 3, 2007

(54) METHOD FOR FABRICATING SEMICONDUCTOR DEVICE CAPABLE OF PREVENTING DAMAGES TO CONDUCTIVE STRUCTURE

(75) Inventors: Sung-Kwon Lee, Ichon-shi (KR); Min-Suk Lee, Ichon-shi (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 20 days.

(21) Appl. No.: 10/880,346

(22) Filed: Jun. 30, 2004

(65) Prior Publication Data
US 2005/0112865 A1 May 26, 2005

(30) Foreign Application Priority Data
Nov. 21, 2003 (KR) ............ 10-2003-0083157

(51) Int. Cl.
*H01L 21/44* (2006.01)

(52) U.S. Cl. ............ 438/672; 438/256; 438/675; 438/399; 438/592; 257/E21.649

(58) Field of Classification Search ........ 438/672, 438/256, 396, 399, 638, 675, 704, 592; 257/E21.649
See application file for complete search history.

(56) References Cited

U.S. PATENT DOCUMENTS

| | | | |
|---|---|---|---|
| 5,840,624 A * | 11/1998 | Jang et al. ............ | 438/624 |
| 6,187,672 B1 * | 2/2001 | Zhao et al. ............ | 438/639 |
| 6,667,228 B2 * | 12/2003 | Lee et al. ............ | 438/592 |
| 6,740,566 B2 * | 5/2004 | Lyons et al. ............ | 438/424 |
| 6,784,084 B2 * | 8/2004 | Kang et al. ............ | 438/586 |
| 6,914,318 B2 * | 7/2005 | Lee et al. ............ | 257/522 |
| 6,930,003 B2 * | 8/2005 | Yamamukai ............ | 438/267 |
| 2002/0175384 A1 * | 11/2002 | Ngai et al. ............ | 257/408 |
| 2004/0082162 A1 * | 4/2004 | Kang et al. ............ | 438/629 |
| 2004/0102039 A1 * | 5/2004 | Lim et al. ............ | 438/674 |
| 2004/0209477 A1 * | 10/2004 | Buxbaum et al. ............ | 438/710 |
| 2005/0017363 A1 * | 1/2005 | Lin et al. ............ | 257/758 |

* cited by examiner

*Primary Examiner*—Michelle Estrada
*Assistant Examiner*—Nicholas Tobergte
(74) *Attorney, Agent, or Firm*—McDermott Will & Emery LLP (57) ABSTRACT

Disclosed is a method for fabricating a semiconductor device with protected conductive structures. The method includes the steps of: forming a plurality of conductive structures on a substrate, each conductive structure including a conductive layer and a hard mask insulation layer formed on the conductive layer; forming a first insulation layer on the conductive structures; forming a plurality of plugs contacted to the substrate disposed between the conductive structures by passing through the first insulation layer and having a predetermined height corresponding to a height between the conductive layer and a top of the hard mask insulation layer; forming an attack barrier layer covering top and sidewalls of the hard mask insulation layer; forming a second insulation layer on the attack barrier layer; and selectively etching the second insulation layer to form a contact hole exposing at least one of the plugs.

18 Claims, 5 Drawing Sheets

FIG. 1

(PRIOR ART)

METHOD FOR FABRICATING SEMICONDUCTOR DEVICE CAPABLE OF PREVENTING DAMAGES TO CONDUCTIVE STRUCTURE

FIELD OF THE INVENTION

The present invention relates to a method for fabricating a semiconductor device; and, more particularly, to a method for fabricating a semiconductor device capable of preventing a conductive structure from being damaged during formation of a contact.

DESCRIPTION OF RELATED ARTS

There have been made various attempts to achieve large-scale of integration and high performance of a semiconductor device. Among these attempts, securing a contact area is an essential asset for obtaining large-scale of integration.

Figure 1:
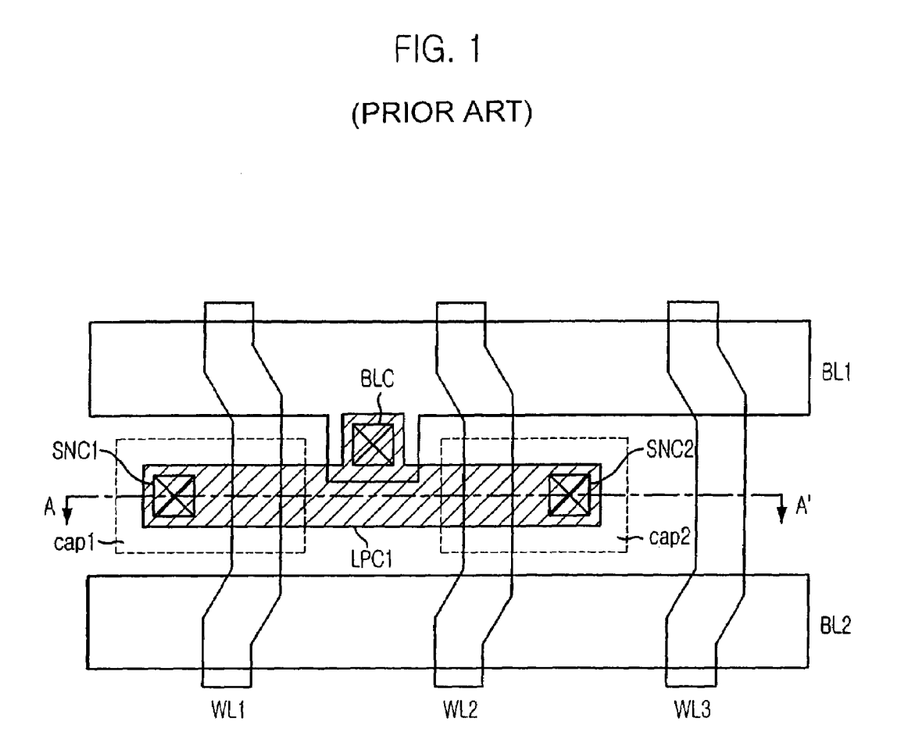
FIG. 1 is a top view showing a layout of a conventional semiconductor memory device having a structure of one transistor one capacitor (1T1C)

FIG. 1 is a top view showing a layout of a conventional semiconductor memory device having a structure of one transistor one capacitor (1T1C).

As shown, a plurality of gate electrodes, for instance, a first to a third word lines WL1, WL2 and WL3, are arranged in one direction. A first bit line BL1 and a second bit line BL2 are arranged in a crossing direction to the first to the third word lines WL1 to WL3. Also, there is a landing plug contact LPC1 made of polysilicon. Also, although not illustrated, the landing plug contact LPC1 is connected to a substrate through a contact hole formed by using a T-type mask pattern exposing a predetermined portion of the substrate, e.g., an impurity diffusion region. In a central portion of the landing plug contact LPC1, a bit line contact BLC is formed such that the bit line contact BLC contacts the first bit line BL1. Two edge portions of the landing plug contact LPC1 are electrically connected with a first capacitor Cap1 and a second capacitor Cap2 through a first storage node contact SNC1 and a second storage node contact SNC2, respectively.

Figure 2A:
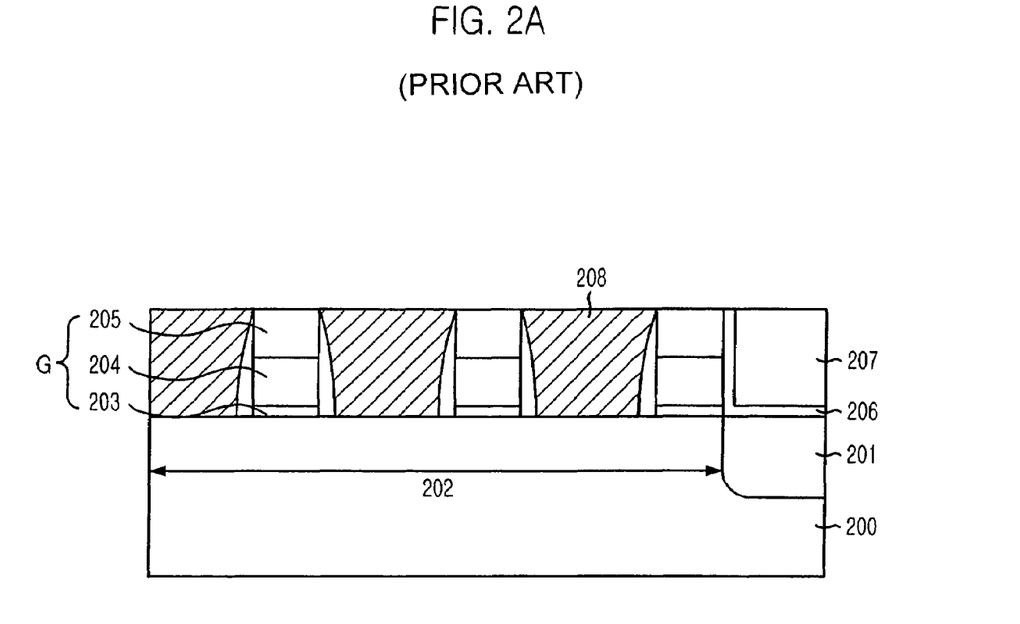
FIGS. 2A to 2C are cross-sectional views illustrating a method for fabricating a conventional semiconductor device.
Figure 2B:
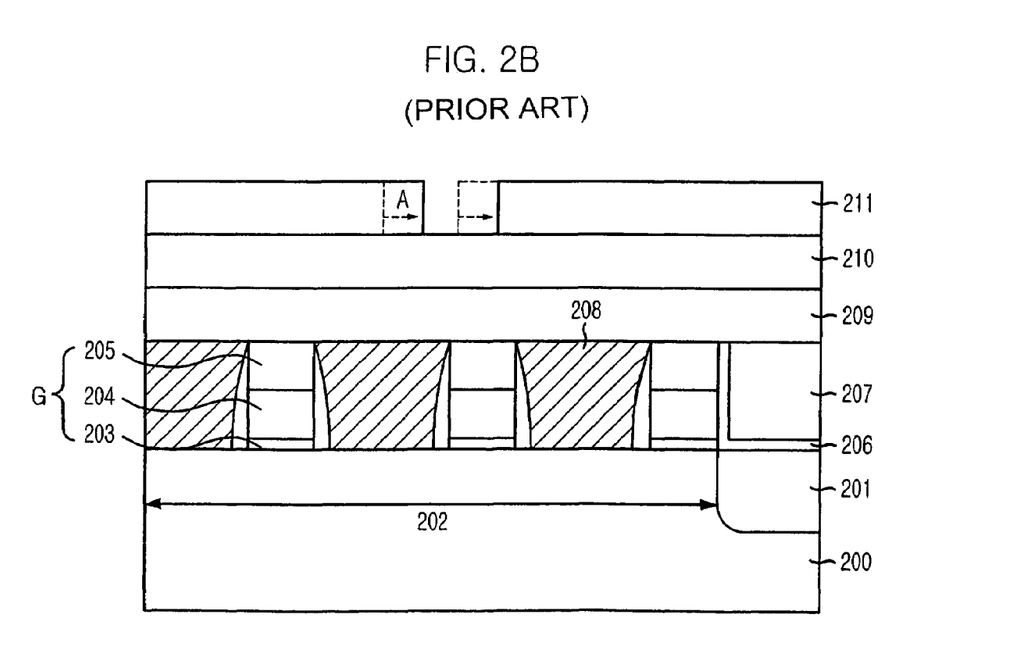
Figure 2C:
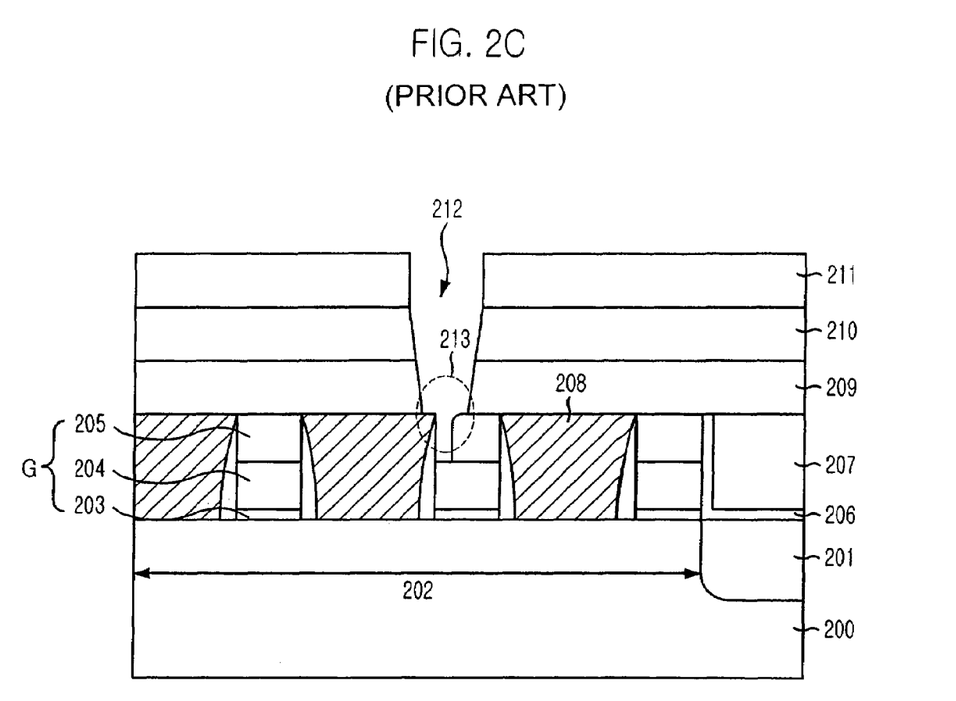

FIGS. 2A to 2C are cross-sectional views of a conventional semiconductor device taken along a line of A–A' shown in FIG. 1.

A field oxide layer 201 is formed in a substrate 200 provided with various device elements, thereby defining an active region 202 and a field region in which the field oxide layer 201 is formed. Particularly, the field oxide layer 201 is made of an oxide-based material and is formed by employing a shallow trench isolation (STI) method and a local oxidation of silicon (LOCOS) method.

After the formation of the field oxide layer 201, a gate insulation layer 203, a gate conductive layer 204 and a hard mask insulation layer 205 are sequentially formed on the substrate 200. Then, the gate insulation layer 203, the gate conductive layer 204 and the hard mask insulation layer 205 are subjected to a photolithography process using a mask for use in a gate structure. From this photolithography process, a plurality of gate structures G including the gate insulation layer 203, the gate conductive layer 204 and the hard mask insulation layer 205 are formed.

Herein, the gate insulation layer 203 is made of an oxide-based material such as silicon oxide. The gate conductive layer 204 is made of a material selected in single or in combination from polysilicon, tungsten, tungsten nitride, and tungsten silicide. Also, the hard mask insulation layer 205 is made of a nitride-based material such as silicon nitride or silicon oxynitride. Especially, since the nitride-based material has a different etch selectivity from an oxide-based inter-layer insulation layer which will be subsequently formed, the use of the nitride-based material as the hard mask insulation layer 205 makes it possible to obtain an intended etch profile during a self-aligned contact (SAC) etching process for forming a plug in a cell region as simultaneous as to prevent the gate structures G from being damaged during the SAC etching process.

Next, an etch stop layer 206 is formed on the gate structures G. The etch stop layer 206 is made of a nitride-based material having a different etch selectivity from oxide in order to prevent the hard mask insulation layer 205 from being damaged during the SAC etching process. Examples of such nitride-based material are silicon nitride and silicon oxynitride.

Meanwhile, as a margin for the SAC etching process decreases because of increase in an aspect ratio, a single nitride-based layer cannot fully function as the etch stop layer 206. Thus, the etch stop layer 206 is formed with multiple nitride layers.

However, the use of the nitride-based material as the etch stop layer 206 may induce a stress when the nitride-based etch stop layer 206 contacts the substrate 200 and may become a source for increasing a parasitic capacitance because nitride has higher permittivity than oxide dose. Therefore, the etch stop layer 206 is formed by stacking oxide and nitride.

A first insulation layer 207 for electrically isolating an inter-layer insulation layer and the gate structures G from each other is formed on the above resulting substrate structure. Herein, the first insulation layer 207 is made of an oxide-based material such as borophosphosilicate glass (BPSG), borosilicate glass (BSG), phosphosilicate glass (PSG), tetraethylorthosilicate (TEOS), advanced planarization layer (APL), spin on glass (SOG), or high density plasma (HDP) oxide.

Although not illustrated, a photoresist layer for use in $F_2$ photolithography device, or in an ArF photolithography device is formed on the first insulation layer 207 by using a spin coating method. Cyclic olefin maleic anhydride (COMA) and acrylate are examples of the photoresist layer. Particularly, the COMA is used as the photoresist layer for use in a $F_2$ photolithography device. Then, with use of a predetermined reticle for defining a width of a contact plug and a $F_2$ or ArF photolithography device, predetermined portions of the photoresist layer are selectively photo-exposed, and a developing process makes photo-exposed portions or non-photo-exposed portions remain. A cleaning process is then performed to remove etch remnants to thereby form a first photoresist pattern, which is a mask for opening a cell contact. Herein, among various types of a photoresist pattern such as a hole type, a bar type and a T-shaped type, the above described first photoresist pattern is formed in the T-shaped type.

Subsequently, the first insulation layer 207 is etched by using the first photoresist pattern as an etch mask to expose a respective portion of the etch stop layer 206 disposed between each two of the gate structures G. This etching process is a SAC etching process. From this SAC etching process, a plurality of contact holes (not shown) are formed.

At this time, the SAC etching process proceeds by employing a typical SAC etching process recipe. It more detail of the SAC etching process recipe, a gas of $C_xF_y$, where x and y representing atomic ratios range from 1 to 10, is used as a main etch gas. Such gases as $C_2F_4$, $C_2F_6$, $C_3F_8$, $C_4F_6$, $C_5F_8$, or $C_5F_{10}$ are examples of the main etch gas. Then, a gas for producing polymers during the SAC etching process such as $CH_2F_2$, $C_3HF_5$ or $CHF_3$ is added to the main etch gas along with use of a carrier gas selected from an inert gas group such as He, Ne, Ar and Xe.

Afterwards, the exposed portions of the etch stop layer 206 are removed to thereby expose predetermined portions of the substrate, more particularly, impurity diffusion regions. Herein, the removal of the exposed etch stop layer 206 proceeds by employing a blanket etch process. After the blanket etch process, the etch stop layer 206 disposed on sidewalls of the gate structures G remains as a spacer.

Next, the first photoresist pattern is removed by performing a conventional photoresist stripping process. A wet cleaning process is performed with use of a cleaning solution such as buffered oxide etchant (BOE) or hydrofluoric acid (HF) in order to secure a critical dimension of each bottom of the contact holes and remove etch remnants remaining after the blanket etch process. Especially, if HF is used as the cleaning solution, diluted HF, obtained by mixing HF and water in a ratio of 1 part of HF to 50 parts to 500 parts of water, is used.

After the wet cleaning process, a conductive material for forming a plug is filled into the contact holes. Polysilicon is the most commonly used conductive material. Such a barrier metal layer of Ti and TiN can be used along with the use of polysilicon. Also, it is possible to use a metal such as tungsten instead of polysilicon.

Then, a chemical mechanical polishing (CMP) process is performed until the hard mask insulation layer 205 is exposed, so that a plurality of plugs 208 are formed. At this time, each plug 208 is electrically connected with the corresponding impurity diffusion regions of the substrate 200 and is planarized at the same level of the hard mask insulation layer 205.

Referring to FIG. 2B, a second insulation layer 209 is formed on the above planarized substrate structure.

Although not illustrated, bit line contact plugs and bit lines are formed through a series of processes. First, a second photoresist pattern for forming a bit line contact is formed and is used as an etch mask when the second insulation layer 209 is selectively etched. From this etching process, bit line contact holes opening a group of the plugs 208 are formed. Then, bit line contact plugs contacted to the group of plugs 208 are formed. Afterwards, a conductive material for use in a bit line and another hard mask insulation layer for use in a bit line are sequentially formed. Herein, such a material selected in single or in combination from tungsten, tungsten nitride, polycide and polysilicon is used as the conductive material for use in the bit line. Also, the hard mask insulation layer for use in the bit line is made of a nitride-based material.

Second, a third photoresist pattern for forming a bit line is formed on the conductive material for use in the bit line and the hard mask insulation layer for use in the bit line. Then, the conductive material for use in the bit line and the hard mask insulation layer for use in the bit line are etched by using the third photoresist pattern as an etch mask, so that bit lines including the patterned conductive material and the patterned hard mask insulation layer are formed.

Next, a third insulation layer 210 is formed on the bit lines. Herein, the second insulation layer 209 and the third insulation layer 210 are made of the same oxide-based material used for forming the first insulation layer 207. A fourth photoresist pattern 211 is then formed thereon. Herein, the forth photoresist pattern 211 serves a role in forming a storage node contact hole by opening another group of the plugs designated for a storage node contact. Also, a reference denotation A denotes a case of the misaligned forth photoresist pattern 211.

Meanwhile, it is also possible to form a nitride-based etch stop layer along a profile containing the bit lines in order to protect the bit lines against an etching process for forming a storage node contact.

Referring to FIG. 2C, the third insulation layer 210 and the second insulation layer 209 are sequentially etched with use of the forth photoresist pattern 211 as an etch mask. From this etching process, a storage node contact hole 212 exposing a portion of the selected plug 208 is formed. In order to form the storage node contact hole 212, the third insulation layer 210 and the second insulation layer 209 are included in the etch target of the above etching process, and thus, the total etch target thickness is increased. Hence, compared with the typical SAC etching process, the above etching process needs to be an over-etching in order to form the storage node contact hole 212.

In addition, because of the misalignment of the forth photoresist pattern, the hard mask insulation layer 205 of the gate structure G is also damaged by the over-etching process. This damage is denoted with a reference numeral 213. Because of this damage 213, an electric short between a subsequent storage node contact plug and the gate conductive layer 204 occurs. Even if the conductive layer 204 is not exposed, an insulation characteristic between the storage node contact plug and the gate conductive layer 204 becomes degraded, further increasing a chance of leakage currents.

In more detail of the electric short, if the hard mask insulation layer of the gate structure has a thickness of 1,000 Å, there is a rare case of SAC failure during the SAC etching process. However, as described in FIGS. 2B and 2C, because the photoresist pattern for forming the storage node contact is misaligned, there may be an electric short between the storage node contact plug and the gate structure even if the hard mask insulation layer of the gate structure has a thickness of 1,200 Å.

Also, compared with the case that the etch stop layer is formed by using oxide and nitride, the damage to the gate structure as shown in FIG. 2C is observed less frequently when the etch stop layer is formed by using only nitride. Thus, formation of the etch stop layer with combination of oxide and nitride for reducing a parasitic capacitance and a stress may bring out more problems.

SUMMARY OF THE INVENTION

It is, therefore, an object of the present invention to provide a method for fabricating a semiconductor device capable of preventing a conductive pattern from being damaged during a contact formation process.

It is another object of the present invention to provide a method for fabricating a semiconductor device capable of improving a process margin and preventing a gate structure from being damaged even if a mask for use in a storage node contact is misaligned in the course of forming the storage node contact.

In accordance with an aspect of the present invention, there is provided a method for fabricating a semiconductor device, including the steps of: forming a plurality of conductive structures on a substrate, each conductive structure including a conductive layer and a hard mask insulation layer formed on the conductive layer; forming a first insulation layer on the conductive structures; forming a plurality of plugs contacted to the substrate disposed between the conductive structures by passing through the first insulation layer and having a predetermined height corresponding to a height between the conductive layer and a top of the hard mask insulation layer; forming an attack barrier layer covering top and sidewalls of the hard mask insulation layer; forming a second insulation layer on the attack barrier layer; and selectively etching the second insulation layer to form a contact hole exposing at least one of the plugs.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A method for fabricating a semiconductor device capable of preventing damages to a conductive structure in accordance with a preferred embodiment of the present invention will be described in detail with reference to the accompanying drawings.

FIGS. 3A to 3D are cross-sectional views illustrating a method for forming a storage node contact hole in a semiconductor device in accordance with a preferred embodiment of the present invention.

Figure 3A:
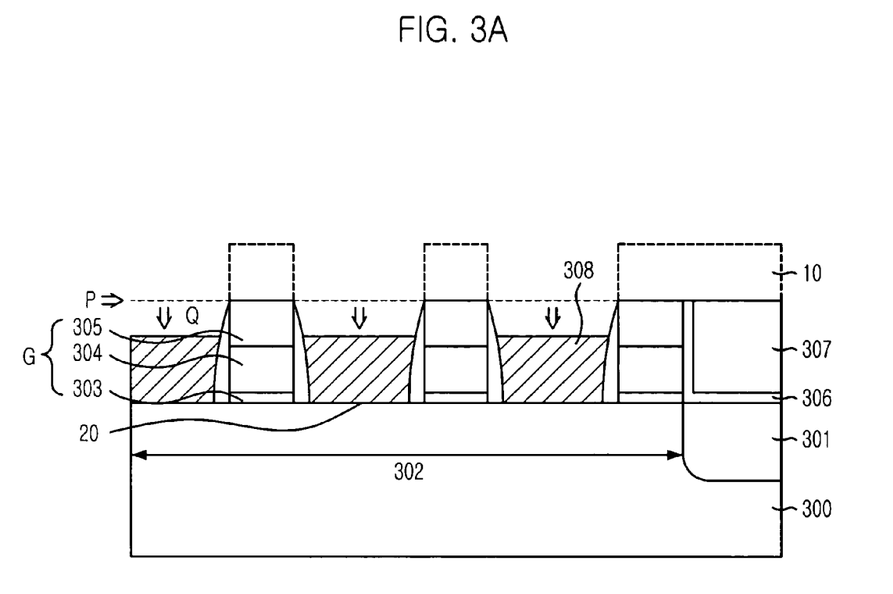
FIGS. 3A to 3D are cross-sectional views illustrating a method for forming a storage node contact hole in a semiconductor device in accordance with a preferred embodiment of the present invention.

Referring to FIG. 3A, a field oxide layer 301 is formed in a substrate 300 provided with various device elements, thereby defining an active region 302 and a field region in which the field oxide layer 301 is formed. Particularly, the field oxide layer 301 is made of an oxide-based material and is formed by employing a shallow trench isolation (STI) method and a local oxidation of silicon (LOCOS) method.

After the formation of the field oxide layer 301, a gate insulation layer 303, a gate conductive layer 304 and a hard mask insulation layer 305 are sequentially formed on the substrate 300. Then, the gate insulation layer 303, the gate conductive layer 304 and the hard mask insulation layer 305 are subjected to a photolithography process using a mask for forming a gate structure. From this photolithography process, a plurality of gate structures G including the gate insulation layer 303, the gate conductive layer 304 and the hard mask insulation layer 305 are formed.

Herein, the gate insulation layer 303 is made of an oxide-based material such as silicon oxide. The gate conductive layer 304 is made of a material selected in single or in combination from polysilicon, tungsten, tungsten nitride, and tungsten silicide. Also, the hard mask insulation layer 305 is made of a nitride-based material such as silicon nitride or silicon oxynitride. Especially, since the nitride-based material has a different etch selectivity from an oxide-based inter-layer insulation layer which will be subsequently formed, the use of the nitride-based material as the hard mask insulation layer 305 makes it possible to obtain an intended etch profile during a self-aligned contact (SAC) etching process for forming a plug as simultaneous as to prevent the gate structures G from being damaged during the SAC etching process.

Next, an etch stop layer 306 is formed on the gate structures G. The etch stop layer 306 is made of a nitride-based material having a different etch selectivity from oxide in order to prevent the hard mask insulation layer 305 from being damaged during the SAC etching process. Examples of such nitride-based material are silicon nitride and silicon oxynitride.

Meanwhile, as a margin for the SAC etching process decreases because of increase in an aspect ratio, a single nitride-based layer cannot fully function as the etch stop layer 306. Thus, the etch stop layer 306 is formed with multiple nitride layers.

However, the use of the nitride-based material as the etch stop layer 306 may induce a stress when the nitride-based etch stop layer 306 contacts the substrate 300 and may become a source for increasing a parasitic capacitance because nitride has high permittivity than oxide. Therefore, the etch stop layer 306 is formed by stacking oxide and nitride.

A first insulation layer 307 for electrically isolating an inter-layer insulation layer and the gate structures G from each other is formed on the above resulting substrate structure. Herein, the first insulation layer 307 is made of an oxide-based material such as borophosphosilicate glass (BPSG), borosilicate glass (BSG), phosphosilicate glass (PSG), tetraethylorthosilicate (TEOS), advanced planarization layer (APL), spin on glass (SOG), or high density plasma (HDP) oxide.

Although not illustrated, a photoresist layer for use in $F_2$ photolithography device, or in an ArF photolithography device is formed on the first insulation layer 307 by using a spin coating method. Cyclic olefin maleic anhydride (COMA) and acrylate are examples of the photoresist layer. Particularly, the COMA is used as the photoresist layer for use in a $F_2$ photolithography device. Then, with use of a predetermined reticle for defining a width of a contact plug and a $F_2$ or ArF photolithography device, predetermined portions of the photoresist layer are selectively photo-exposed, and a developing process makes photo-exposed portions or non-photo-exposed portions remain. A cleaning process is then performed to remove etch remnants to thereby form a first photoresist pattern 10, which is a mask for opening a cell contact. Herein, among various types of a photoresist pattern such as a hole type, a bar type and a T-shaped type, the above described first photoresist pattern 10 is formed in the T-shaped type.

Also, it is possible to form an anti-reflective coating layer between the first photoresist pattern 10 and the first insulation layer 307 for the purpose of preventing formation of an undesired pattern caused by scattering reflection occurring as a result of a high index of reflection of the first insulation layer 307 and of improving adhesion between the first photoresist pattern 10 and the first insulation layer 307. The anti-reflective coating layer is mainly made of an organic material having a similar etch characteristic to the first photoresist pattern 10. The formation of the anti-reflective coating layer can also be omitted.

In addition, it is also possible to form a hard mask between the first insulation layer 307 and the anti-reflective coating layer, or between the first insulation layer 307 and the first photoresist pattern 10. At this time, the hard mask is made of a nitride-based insulating material or a conductive material such as tungsten or polysilicon.

Subsequently, the first insulation layer 307 is etched by using the first photoresist pattern 10 as an etch mask to expose a respective portion of the etch stop layer 306 disposed between each two of the gate structures G. This etching process is a SAC etching process. From this SAC etching process, a plurality of contact holes 20 are formed.

At this time, the SAC etching process proceeds by employing a typical SAC etching process recipe. In more detail of the SAC etching process recipe, a gas of $C_xF_y$, where x and y representing atomic ratios range from 1 to 10, is used as a main etch gas. The main etch gas is selected from a group consisting of $C_2F_4$, $C_2F_6$, $C_3F_8$, $C_4F_6$, $C_5F_8$, and $C_5F_{10}$. Then, a gas for producing polymers during the SAC etching process such as $CH_2F_2$, $C_3HF_5$ or $CHF_3$ is added to the main etch gas along with use of a carrier gas selected from an inert gas group such as He, Ne, Ar and Xe.

Afterwards, the exposed etch stop layer 306 is removed to thereby expose predetermined portions of the substrate 300, more particularly, impurity diffusion regions (not shown). Herein, the removal of the exposed etch stop layer 306 proceeds by employing a blanket etch process. After the blanket etch process, the etch stop layer 306 disposed on sidewalls of the gate structures G remains as a spacer.

Next, the first photoresist pattern 10 is removed by performing a conventional photoresist stripping process. A wet cleaning process is then performed with use of a cleaning solution such as buffered oxide etchant (BOE) or hydrofluoric acid (HF) in order to secure a critical dimension of each bottom of the contact holes 20 and remove etch remnants remaining after the blanket etch process. Especially, if HF is used as the cleaning solution, diluted HF, obtained by mixing HF and water in a ratio of 1 part of HF to 50 parts to 500 parts of water, is preferably used.

After the wet cleaning process, a conductive material for forming a plug is filled into the contact holes 20. At this time, the conductive material can be Polysilicon. Such a barrier metal layer of Ti and TiN can also be used along with the use of polysilicon. Also, it is possible to use a metal such as tungsten instead of polysilicon.

Then, a chemical mechanical polishing (CMP) process is performed until the hard mask insulation layer 305 is exposed, so that a plurality of plugs 308 are formed. At this time, each plug 308 is electrically connected with the corresponding impurity diffusion regions of the substrate 300 and is planarized at the same level of the hard mask insulation layer 305. Subsequent to the formation of the plugs 308, a blanket etch-back process is performed until the plugs 308 have nearly the same height of the gate conductive layer 304. Also, it is possible to employ a blanket etch-back process instead of the CMP process when forming the plugs 308. In this case, the blanket etch-back process is solely performed until the height of the plugs 408 is decreased by a predetermined thickness expressed as a reference denotation Q.

At this time, such a gas as $C_2F_6$, $Cl_2$ and HBr each supplied in a range from approximately 10 sccm to approximately 100 sccm is used as an etch gas, and a pressure and a power are supplied in a range from approximately 5 mTorr to approximately 50 mTorr and in a range from approximately 100 W and approximately 500 W, respectively.

Meanwhile, instead of depositing the above mentioned conductive material for forming the plugs 308 on the resulting substrate structure, a selective epitaxial growth (SEG) method can be applied to form the plugs 308 until the plugs 308 reaches to a height between the gate conductive layer 404 and the top of the hard mask insulation layer 305.

Figure 3B:
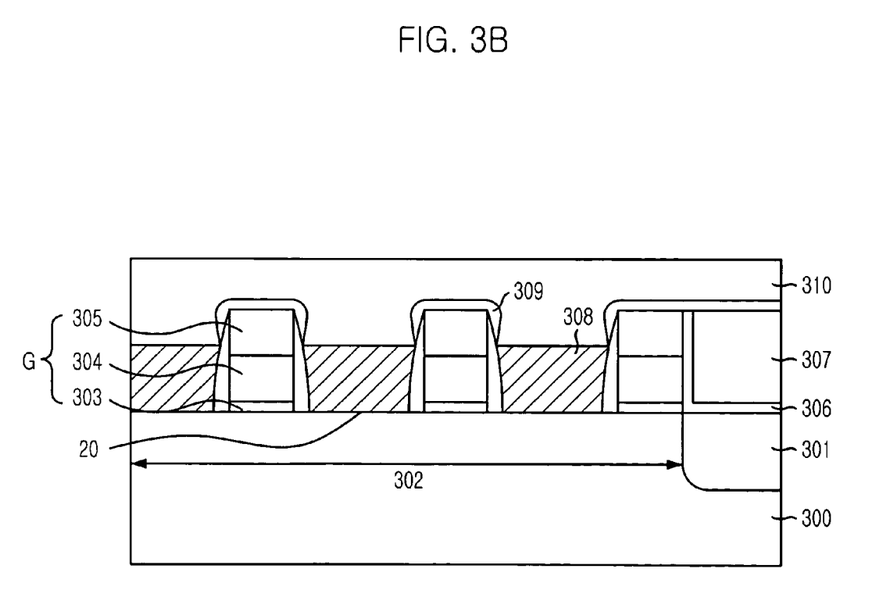

Referring to FIG. 3B, an attack barrier layer 309 made of a nitride-based material is formed on the plugs 308 and the gate structures G by using a deposition method having a poor step coverage characteristic. Preferably, a plasma enhanced chemical vapor deposition (PECVD) method is preferably employed. Then, an etch-back process is performed such that the attack barrier layer 309 remains on exposed portions of the gate structures G. That is, the attack barrier layer 309 after the etch-back process remains as a spacer of the hard mask insulation layer 305 of each gate structure G.

At this time, such a gas of $CHF_3$ and $CF_4$ is used as an etch gas each supplied in a range from approximately 10 sccm to approximately 100 sccm, and a pressure and a power are supplied in a range from approximately 10 mTorr to approximately 100 mTorr and in a range from approximately 100 W to approximately 800 W, respectively. It also possible to add an inert gas such as He, Ne or Ar to the etch gas. In this case, the inert gas is supplied in a range from approximately 10 sccm to approximately 100 sccm.

A second insulation layer 310 is formed on the above resulting substrate structure including the attack barrier layer 309. Although not illustrated, a plurality of bit line structures are formed through a series of processes. First, a photoresist pattern for forming a bit line contact is formed on the second insulation layer 310. Then, the second insulation layer 310 is selectively etched by using the photoresist pattern as an etch mask to thereby form bit line contact holes exposing a group of the plugs 308.

Second, a plurality of bit line contact plugs contacted to the group of the plugs 308 are formed. Thereafter, a conductive layer for forming a bit line structure and a nitride-based hard mask insulation layer for forming a bit line structure are formed on the bit line contact plugs. Herein, the conductive layer is made of a material selected in single or in combination from a group consisting of tungsten, tungsten nitride, polycide and polysilicon. Another photoresist pattern for forming a bit line structure is formed and is subsequently used as an etch mask when the above conductive layer and the hard mask insulation layer are etched. From this etching process, bit line structures including the conductive layer and the hard mask insulation layer are formed.

Figure 3C:
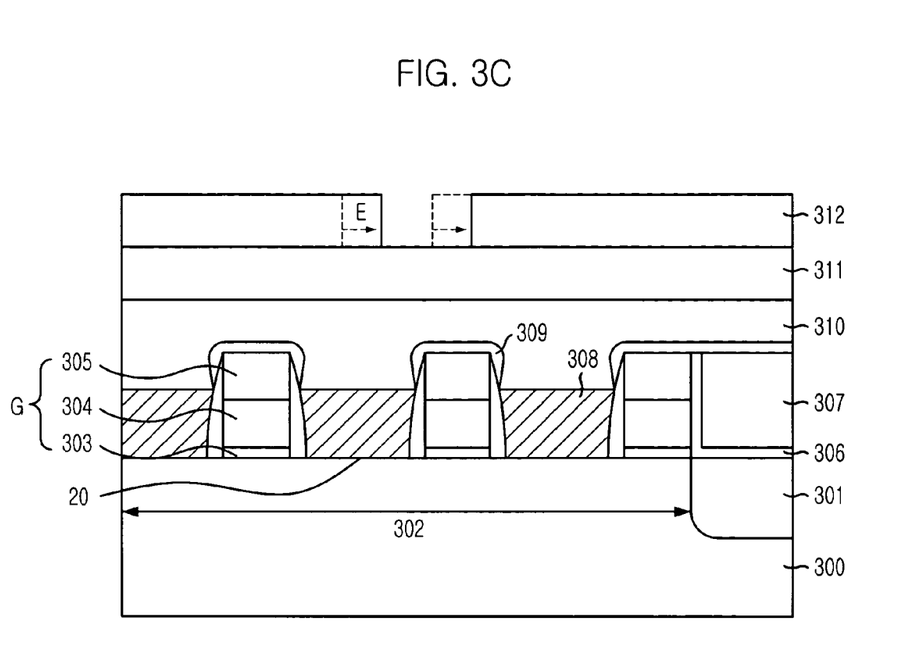

Referring to FIG. 3C, a third insulation layer 311 is formed on the bit line structures. The second insulation layer 310 and the third insulation layer 311 are made of the same oxide-based material used for forming the first insulation layer 307. Afterwards, a second photoresist pattern 312 is formed on the third insulation layer 311 for the purpose of forming a storage node contact hole by opening the selected plug 308 designated for a storage node contact. Herein, a reference denotation E depicts that the second photoresist pattern 312 is misaligned.

Also, it is possible to form additionally an etch stop layer along a profile containing the bit line structures in order to protect the bit line structures against an etching process for forming a subsequent storage node contact. Herein, the etch stop layer is made of a nitride-based material.

Figure 3D:
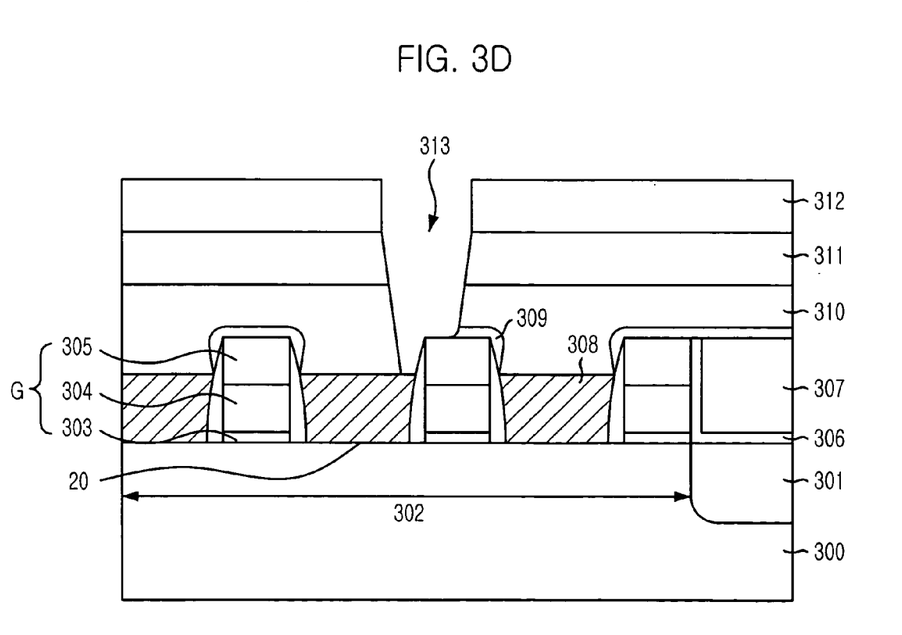

Referring to FIG. 3D, the third insulation layer 311 and the second insulation layer 310 are sequentially etched with use of the second photoresist pattern 312 to form a storage node contact hole 313 exposing a portion of the selected plug 308.

Since the third insulation layer 311 and the second insulation layer 310 are included in the etch target of the above etching process for forming the storage node contact hole 313, the total etch target thickness increases compared with a conventionally performed SAC etching process. Thus, the above etching process needs to be an over-etching in order to form the storage node contact hole 313.

Although not illustrated, a conductive layer is filled into the storage node contact hole 313 and is planarized to form a storage node contact plug connected to the selected plug 308 through the storage node contact hole 313.

In a conventional method for forming a storage node contact hole, a hard mask insulation layer of a gate structure is damaged by a SAC etching process because of a misaligned photoresist pattern for forming a storage node contact hole. In contrary to the conventional method, the preferred embodiment of the present invention shows the case that, because of the attack barrier layer formed on the top and sidewalls of the hard mask insulation layer, the hard mask insulation layer can be protected against damages in the course of forming the storage node contact hole even if the second photoresist pattern is misaligned. Therefore, it is possible to prevent an incidence of electric short between the gate conductive layer and a subsequent storage node contact plug caused by the damaged hard mask insulation layer. It is also possible to prevent an insulating property between the gate conductive layer and the subsequent storage node contact plug. As a result of these effects, it is further possible to increase process margins and improve yields of semiconductor devices.

Although the preferred embodiment of the present invention exemplifies the case of forming the storage node contact hole by etching the insulation layers disposed between the bit line structures, it is still possible to apply this introduced method to any case of fabricating a semiconductor device capable of preventing bottom conductive structures from being damaged during formation of plugs formed above the bottom conductive patterns.

The present application contains subject matter related to the Korean patent application No. KR 2003-0083157, filed in the Korean Patent Office on Nov. 21, 2003, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising the steps of:
    forming a plurality of conductive structures on a substrate, each conductive structure including a conductive layer and a hard mask insulation layer formed on the conductive layer;
    forming a first insulation layer on the conductive structures;
    forming a plurality of plugs contacted to the substrate disposed between the conductive structures by passing through the first insulation layer and having a predetermined height corresponding to a height between the conductive layer and a top of the hard mask insulation layer;
    forming attack barrier layers covering each top portion of the hard mask insulation layers to protect the hard mask insulation layers;
    forming a second insulation layer on the attack barrier layer and the plugs; and
    selectively etching the second insulation layer to form a contact hole exposing at least one of the plugs, wherein the attack barrier layers protect the hard mask insulation layers against damage in the course of forming the contact hole.

2. The method of claim 1, wherein the step of forming the plugs includes the steps of:

selectively etching the first insulation layer to form openings exposing the substrate between the conductive structures;
filling a conductive material into the openings;
removing the conductive material until the hard mask insulation layer is exposed, thereby forming the isolated plugs; and
recessing the plugs until the plugs reaches to a height between the conductive layer and a top of the hard mask insulation layer.

3. The method of claim 2, wherein the step of isolating the plugs proceeds by employing a chemical mechanical polishing process.

4. The method of claim 2, wherein the step of isolating the plugs proceeds by employing a blanket etch-back process.

5. The method of claim 2, wherein the step of recessing the plugs proceeds by employing a blanket etch-back process using an etch gas of $C_2F_6$, $Cl_2$ and HBr.

6. The method of claim 1, wherein the step of forming the plugs includes the steps of:
    selectively etching the first insulation layer to form openings exposing the substrate disposed between the conductive structures; and
    performing a selective epitaxial growth (SEG) method to form the plugs, the SEG method performed until the plugs reaches to a height between the conductive layer and a top of the hard mask insulation layer.

7. The method of claim 1, wherein the step of forming the attack barrier layer includes the steps of:
    forming the attack barrier layer on the plugs and the conductive structures; and
    performing an etch-back process until the attack barrier layer remains on top and sidewalls of the hard mask insulation layer.

8. The method of claim 7, wherein the attack barrier layer is a nitride-based layer and is formed by employing a plasma enhanced chemical vapor deposition (PECVD) method.

9. The method of claim 8, wherein the step of performing the etch-back process proceeds by using an etch gas of $CHF_3$ and $CF_4$.

10. The method of claim 1, after the step of forming the conductive structures, further including the step of forming an etch stop layer along a profile containing the conductive structures.

11. The method of claim 10, wherein the etch stop layer has a structure of multiple nitride layers.

12. The method of claim 10, wherein the etch stop layer has a stack structure of oxide and nitride.

13. The method of claim 1, wherein the conductive structures are gate structures.

14. The method of claim 1, wherein the conductive structures are bit line structures.

15. The method of claim 1, wherein the conductive structures are metal wires.

16. The method of claim 1, after the step of forming the contact holes, further including the step of forming a conductive layer filled into the contact holes and electrically connected with said at least one plug.

17. The method of claim 16, wherein the conductive layer is a storage node contact plug.

18. The method of claim 1, wherein the second insulation layer is formed by using multiple oxide layers.

* * * * *